US010790157B1

(12) United States Patent
Oehrlein et al.

(10) Patent No.: US 10,790,157 B1
(45) Date of Patent: Sep. 29, 2020

(54) ACHIEVING ETCHING SELECTIVITY FOR ATOMIC LAYER ETCHING PROCESSES BY UTILIZING MATERIAL-SELECTIVE DEPOSITION PHENOMENA

(71) Applicant: University of Maryland, College Park, College Park, MD (US)

(72) Inventors: Gottlieb S. Oehrlein, Clarksville, MD (US); Kang-Yi Lin, Greenbelt, MD (US); Chen Li, College Park, MD (US)

(73) Assignee: University of Maryland, College Park, College Park, MD (US)

(*) Notice: Subject to any disclaimer, the term of this patent is extended or adjusted under 35 U.S.C. 154(b) by 0 days.

(21) Appl. No.: 16/512,896

(22) Filed: Jul. 16, 2019

(51) Int. Cl.
*H01L 21/311* (2006.01)
*H01L 21/02* (2006.01)

(52) U.S. Cl.
CPC .... *H01L 21/31144* (2013.01); *H01L 21/0212* (2013.01); *H01L 21/31116* (2013.01); *H01L 21/31122* (2013.01); H01L 21/02274 (2013.01)

(58) Field of Classification Search
CPC ......... H01L 21/31144; H01L 21/31122; H01L 21/31116; H01L 21/0212; H01L 21/02274
See application file for complete search history.

(56) References Cited

U.S. PATENT DOCUMENTS

| | | | |
|---|---|---|---|
| 9,620,382 B2 * | 4/2017 | Oehrlein | H01J 37/32146 |
| 10,566,213 B2 * | 2/2020 | Kanarik | H01L 21/0228 |
| 2005/0032317 A1 * | 2/2005 | Sandhu | H01L 21/02178 |
| | | | 438/287 |
| 2015/0217330 A1 * | 8/2015 | Haukka | C23C 16/28 |
| | | | 427/343 |
| 2016/0181117 A1 * | 6/2016 | Arghavani | H01L 21/31116 |
| | | | 438/712 |
| 2018/0138075 A1 * | 5/2018 | Kang | H01L 21/31116 |
| 2019/0244805 A1 * | 8/2019 | Tan | H01J 37/3244 |

OTHER PUBLICATIONS

D. Athavale, D.J. Economou, *J Vac Sci Technol B* 14, 3702-3705 (1996).
D. Athavale, D.J. Economou, *Journal of Vacuum Science & Technology a—Vacuum Surfaces and Films* 13, 966-971 (1995).
D. Metzler, C. Li, S. Englemann, R.L. Bruce, E.A. Joseph, G.S. Qehrlein, *J Chem Phys* 146, 052801 (2017).

* cited by examiner

Primary Examiner — Anita K Alanko
(74) Attorney, Agent, or Firm — Stanek Lemon Crouse & Meeks, PA (57) ABSTRACT

Provided is a method of selectively etching a substrate including at least one cycle of: depositing a chemical precursor on a surface of the substrate, the substrate including a first portion and a second portion, to selectively form a chemical precursor layer on a surface of the first portion of the substrate without forming or substantially without forming the chemical precursor layer on a surface of the second portion of the substrate, wherein the first portion of the substrate and the second portion of the substrate are of different composition; exposing the chemical precursor layer on the surface of the first portion of the substrate and the surface of the second portion of the substrate to a plasma environment subjected to a bias power; and selectively and in a self-limited fashion removing at least a part of the second portion of the substrate, and repeating the cycle until the second portion of the substrate is substantially or completely removed.

20 Claims, 3 Drawing Sheets

ACHIEVING ETCHING SELECTIVITY FOR ATOMIC LAYER ETCHING PROCESSES BY UTILIZING MATERIAL-SELECTIVE DEPOSITION PHENOMENA

STATEMENT OF GOVERNMENT SUPPORT

This invention was made with government support under Grant No. HR0011-18-3-0004 awarded by the Department of Defense/Defense Advanced Research Projects Agency (DARPA). The government has certain rights in the invention.

BACKGROUND

With the development of smaller device nodes, atomic layer etching (ALE) with a high etching selectivity is required. The ALE method is a cyclic process including two steps, which are reactant deposition and self-limited etching steps. In the reactant deposition step, a controlled amount of a precursor, or precursors, is injected in the processing chamber, depositing a layer of reactant on substrate surface. In the etch step, radio frequency (RF) bias power is applied to increase the energy of, for example, $Ar^+$ ions, which allows energetic ions to induce ion enhanced chemical reactive etching. Since the ion energy is below the substrate material sputtering energy threshold, once the reacted layer on the surface deposited in the first step is depleted, the etching will stop.

Material etching selectivity of ALE processing is one of the most important objectives of ALE. It has previously been demonstrated that using chlorine gas as reactant in the deposition step it is possible to realize ALE of Si with selectivity relative to $SiO_2$ due to differences in low energy thresholds for chlorinating a monolayer of Si and $SiO_2$, and their physical etching thresholds, respectively. The reacted Si layer is easily removed during the etching step where the $Ar^+$ ion energy is not high enough to sputter away the $SiO_2$ and unreacted Si. Since chlorine-based ALE is not applicable to achieve $SiO_2$ to Si etching selectivity, a fluorocarbon-based ALE that utilizes a higher fluorocarbon (FC) consumption rate of $SiO_2$ compared to Si has been developed. Under optimal processing conditions, the depletion of the FC deposition film on a $SiO_2$ surface takes place, whereas on the Si surface a FC film forms that serves as a passivation layer to minimize Si erosion and enable etching selectivity of $SiO_2$ relative to Si. However, these approaches are more difficult to implement for achieving, for example, $HfO_2$ to Si etching selectivity. $HfO_2$ has a higher bonding strength compared to Si and $SiO_2$ and its FC consumption rate is much lower than other Si-based materials, so the above-mentioned approaches for selective ALE are not feasible in this situation.

Accordingly, innovative methods which utilize the structure and chemistry of hydrocarbon and hydrofluorocarbon (HFC) precursors, for example, $CH_4/CHF_3$, to selectively deposit a HFC film on, for example, an Si surface but not on an $HfO_2$ surface were developed. In contrast, when using $CH_4/C_4F_8$ precursors with the same processing parameters for $HfO_2$ and Si, material-selective deposition is not seen. X-ray photoelectron spectroscopy (XPS) results show that exposure of the $HfO_2$ material to the $CH_4/CHF_3$ precursors in the deposition step modifies the $HfO_2$ surface to a fluorine-terminated surface, which prevents long-term FC deposition on the surface during the FC deposition step. Additionally, the modification facilitates the removal of the fluorinated $HfO_2$

SUMMARY

According to an aspect of the invention, provided is a method of selectively etching a substrate including at least one cycle of: depositing a chemical precursor on a surface of the substrate, the substrate including a first portion and a second portion, to selectively form a chemical precursor layer on a surface of the first portion of the substrate without forming or substantially without forming the chemical precursor layer on a surface of the second portion of the substrate, wherein the first portion of the substrate and the second portion of the substrate are of different composition; exposing the chemical precursor layer on the surface of the first portion of the substrate and the surface of the second portion of the substrate to a plasma environment subjected to a bias power; and selectively removing at least a part of the second portion of the substrate, and repeating the cycle until the second portion of the substrate is substantially or completely removed.

According to another aspect of the invention, provided is a method of atomic layer etching including at least one cycle of: depositing a chemical precursor including fluorine on a surface of a substrate, the substrate including a first portion on a second portion, to selectively form a fluorocarbon film on a surface of the first portion of the substrate without forming or substantially without forming the fluorocarbon film on a surface the second portion of the substrate, wherein the first portion of the substrate and the second portion of the substrate are of different composition; exposing the fluorocarbon film on the surface of the first portion of the substrate and the surface of the second portion of the substrate to a plasma environment subjected to a bias power; and selectively removing at least a part of the second portion of the substrate, and repeating the cycle until the second portion of the substrate is substantially or completely removed.

According to another aspect of the invention, provided is a method of selectively etching a substrate including at least one cycle of: depositing a chemical precursor including a hydrocarbon and a hydrofluorocarbon on a surface of the substrate, the substrate including a first portion and a second portion, by exposing the first portion and second portion to the chemical precursor to selectively form a hydrofluorocarbon film on a surface of the first portion of the substrate without forming or substantially without forming the hydrofluorocarbon film on a surface of the second portion of the substrate, the first portion of the substrate including a-Si, c-Si, poly-Si, Si3N4, SiGe, and/or Ge and the second portion of the substrate including $HfO_2$; exposing the hydrofluorocarbon film on the surface of the first portion of the substrate and the surface of the second portion of the substrate to a plasma environment subjected to a bias power, the plasma environment including argon (Ar), or an ion thereof; and selectively removing at least a part of the second portion of the substrate, and repeating the cycle until the second portion of the substrate is substantially or completely removed.

BRIEF DESCRIPTION OF THE DRAWINGS

FIGS. 2(a)-2(d) illustrate the evolution of layer thicknesses of $HfO_2$ and Si surfaces during ALE processing: FIGS. 2(a) and 2(b) show $CH_4/CHF_3$ and FIGS. 2(c) and 2(d) show $CH_4/C_4F_8$ applied to $HfO_2$ and Si surfaces, respectively. $CH_4/CHF_3$ shows that the deposited film on $HfO_2$ surface during purge steps undergoes self-desorption which does not take place on Si. As a comparison, $CH_4/C_4F_8$ produces a comparable deposition thickness on $HtO_2$ and Si surfaces and does not exhibit a different deposition yield.

FIGS. 3(a)-3(h) illustrate XPS spectra comparing a pristine $HfO_2$ sample with the samples treated by $CH_4/CHF_3$, shown in FIGS. 3(a)-3(d), and $CH_4/C_4F_8$, shown in FIGS. 3(e)-3(h), in the 4th cycle at the end of purge and etching steps, respectively. $CH_4/CHF_3$ allows to remain a fluorinated $HfO_2$ surface blocking formation of a FC film during the purge step, whereas $CH_4/C_4F_8$ at the same step obtains a thick FC deposition film on the top of $HfO_2$.

FIGS. 4(a)-4(f) illustrate XPS spectra comparing a pristine Si sample with the sample treated by $CH_4/CHF_3$, shown in FIGS. 4(a)-4(c), and $CH_4/C_4F_8$, shown in FIGS. 4(d)-4(f), in the 4th cycle at the end of purge and etching steps, respectively. Both sets of precursors are able to deposit a FC film on the top of Si surface.

DETAILED DESCRIPTION

The foregoing and other aspects of the present invention will now be described in more detail with respect to other embodiments described herein. It should be appreciated that the invention can be embodied in different forms and should not be construed as limited to the embodiments set forth herein. Rather, these embodiments are provided so that this disclosure will be thorough and complete, and will fully convey the scope of the invention to those skilled in the art.

The terminology used in the description of the invention herein is for the purpose of describing particular embodiments only and is not intended to be limiting of the invention. As used in the description of the invention and the appended claims, the singular forms "a", "an" and "the" are intended to include the plural forms as well, unless the context clearly indicates otherwise. Additionally, as used herein, the term "and/or" includes any and all combinations of one or more of the associated listed items and may be abbreviated as "/".

Unless otherwise defined, all technical and scientific terms used herein have the same meaning as commonly understood by one of ordinary skill in the art to which this invention belongs.

According to embodiments of the invention, highly selective atomic layer etching (ALE) of semiconductor materials can be provided using, in some embodiments, a combination of hydrocarbon and hydrofluorocarbon (HFC) precursors.

The term atomic layer etching (ALE), as used herein, can broadly refer to the level of layer dimensional control that can be achieved at the angstrom (Å) and nanometer (nm) level. Thus, atomic layer etching may generally correspond to the size of atoms. Additionally, the average removed layer thickness/cycle can be less than 1 Å per etching cycle, or more than 1 Å per cycle, for example, about 1 Å, about 2 Å, about 3 Å, about 4 Å, about 5 Å, about 6 Å, about 7 Å, about 8 Å, about 9 Å, about 10 Å (1 nm), about 11 Å, about 12 Å, about 13 Å, about 14 Å, about 15 Å, about 16 Å, about 17 Å, about 18 Å, about 19 Å, about 20 Å (2 nm), about 2.5 nm, or about 3 nm per cycle.

Although the following discussion mainly focuses on precursors including hydrocarbon, hydrofluorocarbon and/or fluorocarbon, the concept can be applied to other precursors, including complex compounds that contain chlorine, boron trichloride, bromine, oxygen, ammonia and others employed in a plasma etching process. The methods of generating plasma are not limited to the inductively coupled plasma (ICP), for example capacitively coupled plasma (CCP), helicon plasma or electron cyclotron resonance (ECR) plasma may also be adopted to methods of the present invention. In some embodiments, the generated plasma and the plasma environment used in the plasma etching process according to methods of the present invention is a plasma including argon (Ar), for example, such as a steady-state Ar plasma generated in an inductively coupled plasma (ICP) reactor.

The term substrate, as used herein, can broadly refer to any layer or layers upon which processing is desired. Thus, for example, a native oxide film on the surface of a silicon substrate may itself be considered a substrate for the purposes of this discussion. Likewise, a layer, or layers, either adjacent to one another or stacked on one another, deposited on silicon or on other base substrates may likewise be considered substrates in some embodiments. For example, in some embodiments, multiple layers may be formed, and then atomic layer etching may be selectively performed on a layer including a portion of the substrate without etching or substantially without etching another layer or portion of the substrate. In such a case, the portion of the layer on which atomic layer etching is performed may be considered the substrate. The layer or layers upon which the chemical precursor is deposited and/or which reacts with the chemical precursor to form a chemical precursor layer and/or film thereon can be considered the substrate layer(s).

In some embodiments, the substrate may include a surface on which a chemical precursor layer may by formed, or selectively formed. The term, "selectively forming" can mean forming the chemical precursor layer on only a surface of a portion or portions of the substrate, without forming the chemical precursor layer on a surface of another portion or portions of the substrate. In some embodiments, selectively forming a chemical precursor layer on a portion of the substrate may be performed without, for example, application of or use of an etching mask, such as a hard mask, to the surface of the substrate. In some embodiments, for example, when the surface of the substrate, wherein the substrate includes a first portion and a second portion, is exposed to the chemical precursor, the chemical precursor may be deposited on only a surface of a first portion of a substrate to form a chemical precursor layer on the surface of the first portion of the substrate, without formation or substantially without formation of the chemical precursor layer on a surface of a second portion of the substrate, i.e., little or no chemical precursor layer, is formed on the surface of the second portion of the substrate, or in some embodiments, forming a layer of different characteristics, on the surface of the second portion of the substrate than that of the chemical precursor layer formed on the surface of the first portion of the substrate, wherein the first portion and second portion of the substrate are of different composition.

In some embodiments, when the chemical precursor layer is formed on the first portion of the substrate, the chemical precursor layer passivates, i.e., may render a portion or portions of the substrate substantially or completely inert to, or resistant to, the ALE process. For example, during the ALE process, the chemical precursor layer may be etched and removed in an etching cycle, without etching, or minimally etching, the portion or portions of the substrate on which the chemical precursor layer is formed.

In some embodiments, selectively forming of the chemical precursor layer on only the surface of the first portion of the substrate without forming or substantially without forming the chemical precursor layer on the second portion of the substrate may result from differences in composition and/or chemistry of the first and second portions of the substrate. In some embodiments, when the chemical precursor layer is not formed, substantially not formed, or minimally formed, on the surface of the second portion of the substrate because the second portion of the substrate is inert to formation of the chemical precursor layer, or may react differently with the chemical precursors than the manner in which first portion of the substrate may react with the chemical precursors, which may result in little or no chemical precursor layer being formed on the surface of the second portion of the substrate, or may result in formation of a layer which may, for example, facilitate the ALE process on the second portion of the substrate, or in some embodiments, render the surface of the second portion of the substrate more reactive or susceptible to and thus facilitate the ALE process, or in other words, activate the surface of the second portion of the substrate for etching in the ALE process of the present inventive concept.

Various substrates may be used in studying and evaluating the use of cyclic plasma interacting with the substrate. For example, such substrates may include materials that show chemically enhanced etching in the presence of low energy bombardment and a chemical precursor. The substrates, in the methods of the present inventive concept, can also include at least one of hafnium oxide ($HfO_2$), silicon oxide ($SiO_2$), nitrided hafnium silicate (HfSiON), hafnium silicate ($HfSiO_x$), zirconium dioxide ($ZrO_2$), lanthanum oxide ($La_2O_3$), lanthanum silicate ($LaSiO_x$), lanthanum aluminate ($LaAlO_x$), tantalum pentoxide ($Ta_2O_5$), aluminum oxide ($Al_2O_3$), titanium dioxide ($TiO_2$) and/or zirconium dioxide ($ZrO_2$), and exhibit an etching selectivity relative to a-Si, c-Si, poly-Si, SiGe, Ge and $Si_3N_4$. Additionally, the substrate may have a native oxide layer on the surface of the substrate. Moreover, a thickness of the native oxide layer may vary. For example, the thickness of the native oxide layer may be about 1/10 of 1 nm (1 Å) to about 10 nm. In some embodiments, the substrate can include $HfO_2$, and at least one of Si, a-Si, c-Si, poly-Si, $Si_3N_4$, Ge and/or SiGe. In other embodiments, the substrate can include $HfO_2$, and at least one of Si and/or $Si_3N_4$. In some embodiments, the substrate can include $HfO_2$, and Si. In other embodiments, the substrate can include $HfO_2$, and $Si_3N_4$. In other embodiments, the substrate may include an $HfO_2$ layer and a layer including: at least one of Si, a-Si, c-Si, poly-Si, $Si_3N_4$, Ge and/or SiGe. In some embodiments, the substrate may include an $HfO_2$ layer and an Si layer. In some embodiments, the substrate may include an $HfO_2$ layer and an Si3N4 layer.

The substrate, according to other embodiments, may include, but are not limited to, wafers. The wafers may be of various suitable processing sizes. For example, substrate samples may be on the order of 1 inch or smaller, if desired. Additionally, full wafers of about 200 mm or about 300 mm in diameter, or even larger substrates may be incorporated.

According to some embodiments, angstrom or angstroms (Å) thick precursor layers can be provided/deposited on a surface layer of a substrate. For example, hydrocarbon, HFC, and/or fluorocarbon (FC), chemical precursor layers can be deposited to a thickness of about 1 Å, 2 Å, 3 Å, 4 Å, 5 Å, 6 Å, 7 Å, 8 Å, 9 Å, 10 Å (1 nm), 1.5 nm, 2 nm, 2.5 nm, to about 3 nm on a surface layer, such as an Si surface layer. In some embodiments, the thickness of the chemical precursor layers should be of sufficient thickness to provide an etch selectivity between substrate materials, for example $HfO_z$ to Si or $HfO_2$ to $Si_3N_4$. In some embodiments, the thickness of the precursor layer is at least about 7 Å, about 10 Å, about 15 Å, about 20 Å to about 3 nm. The stoichiometry of the hydrocarbon, HFC, and/or FC precursor layers is variable, and they may include other elements not specifically called out, such as, for example, H. Subsequently, after establishing a gaseous environment of sufficient purity, such as, for example, by maintaining an Ar environment without additional precursor injection, low energy $Ar^+$ ion bombardment can be applied to remove portions of the precursor layer, portions of a reacted surface layer, and controlled portions of the surface layer on which the hydrocarbon, HFC and/or FC precursor layer is not formed or substantially not formed. This may be followed by another period during which an Ar gaseous environment of sufficient purity is established. Such a process can be repeated in a cyclical manner until a desired overall etching depth has been achieved. Further, low energy ion bombardment can be applied in various eV ranges, such as, for example, within a range of about 0 eV up to about 100 eV. In other embodiments, gases such as Ar, including Ne and/or Xe may also be applied.

In some embodiments, the removal of controlled portions of the surface layer on which the hydrocarbon, HFC and/or FC precursor layer is not formed or substantially not formed is a self-limiting process, i.e., the process limits itself to removing, for example, one atomic layer, two atomic layers, three atomic layers, or any defined number of atomic layers, or a defined amount of material of the surface layer, as would be appreciated by one of skill in the art. In some embodiments, the amount of material removed of the surface layer may self-limited to about 1 Å, 2 Å, 3 Å, 4 Å, 5 Å, 6 Å, 7 Å, 8 Å, 9 Å, 10 Å (1 nm), 1.5 nm, 2 nm, 2.5 nm, or to about 3 nm of the surface layer.

The term "hydrocarbon" may refer to a compound containing only hydrogen and carbon. The term "fluorocarbon" (FC) may refer to an organofluorine compound containing only fluorine and carbon, such as a perfluorocarbon, perfluoroalkane, perfluoroalkene, and the like, however, is not strictly limited thereto, and may refer to, in some embodiments, a hydrocarbon in which some or all C—H bonds have been replaced by C—F bonds. An example of a hydrocarbon in which some C—H bonds have been replaced by C—F bonds, is a hydrofluorocarbon (HFC), such as $CHF_3$, $CH_2F_2$, or any $C_kH_mF_a$, or isomers thereof. In some embodiments, k is 1 or 2 in the hydrofluorocarbon $C_kH_mF_n$. In some embodiments, the organofluorine compound may be a monofluorohydrocarbon, i.e., a hydrocarbon on which one hydrogen is substituted with fluorine, for example, fluoromethane ($CFH_3$), fluoroethane ($H_2FC—CH_3$), and vinyl fluoride ($HFC=CH_2$).

An ALE cycle may include a deposition step in which a precursor is injected into a reactor containing the substrate, such as an inductively coupled plasma (ICP) reactor, for a period of time, for example, 1 s, for depositing thinner precursor film layers, such as a 5 Å precursor film layer, or 2 s, for depositing thicker precursor film layers, such as a 10

Å precursor film layer, on the substrate, followed by a purge step to pump out residual reactive gas. In some embodiments, the purge step is about 12 s. The purge step is followed by an etching step performed by applying, for example, an RF bias voltage for a predetermined length of time, as will be further described below.

Material etching can stop once the reacted surface layer and/or a portion of the surface layer has been removed, resulting in a self-limited process. Thus, according to some embodiments, development of atomic layer etching processes for complex materials may be feasible.

In some embodiments, various precursors may be applied in ALE. For example, applicable precursors may include hydrocarbon gas, hydrofluorocarbon (HFC) gas, and/or fluorocarbon (FC) gas. For example, hydrocarbon precursors may include methane ($CH_4$), ethane ($C_2H_6$), ethylene ($C_2H_4$), and acetylene ($C_2H_2$). HFC precursors, may include, for example, monofluorohydrocarbons, such as fluoromethane ($CH_3F$), fluoroethane ($C_2H_5F$), and vinyl fluoride ($C_2H_3F$), and other hydrofluorocarbons, such as, for example, trifluoromethane ($CHF_3$), difluoromethane ($CH_2F_2$), 1,1,1,2-tetrafluoroethane ($F_3C-CHF_2$), 1,1,2,2-tetrafluoroethane ($HF_2C-CHF_2$), and pentafluoroethane ($C_2HF_5$). FC precursors may include tetrafluoromethane ($CF_4$), and hexafluoromethane ($C_2F_6$). In some embodiments, the chemical precursors may include gases containing one and/or two carbons. In some embodiments, the chemical precursors may include a hydrocarbon and/or a monofluorohydrocarbon, and a hydrofluorocarbon and/or a fluorocarbon. For example, in an embodiment, the precursor may include hydrocarbon $CH_4$ and hydrofluorocarbon $CHF_3$. In some embodiments, the precursors used for ALE, for example, a hydrocarbon precursor and an HFC precursor, minimize ion bombardment of a substrate layer on which the precursor is deposited, i.e., provide a passivation layer on the substrate layer. In some embodiments, the substrate layer on which the precursor is deposited is a material with a relatively weak bonding strength, for example, Si, a-Si, c-Si, poly-Si, $Si_3N_4$, Ge and/or SiGe. In some embodiments, the substrate layer includes Si, a-Si, c-Si, and/or poly-Si.

In some embodiments, the precursors do not deposit and/or form, i.e., little or no chemical precursor layer is generated, on a substrate layer when the substrate layer is exposed to the precursors. In some embodiments, the material of the substrate layer on which the precursors do not form a chemical precursor layer have a low FC consumption rate and relatively strong bonding strength and of high dielectric constant, for example, hafnium oxide ($HfO_2$), hafnium silicate ($HfSiO_x$), nitrided hafnium silicate, (HfSiON), lanthanum oxide ($La_2O_3$), lanthanum silicate (La$SiO_x$), lanthanum aluminate ($LaAlO_x$), silicon oxide ($SiO_2$), tantalum pentoxide ($Ta_2O_5$), aluminum oxide ($Al_2O_3$), titanium dioxide ($TiO_2$), and/or zirconium dioxide ($ZrO_2$). In some embodiments, etch selectivity is provided for $HfO_2$, $HfSiO_x$, HfSiON, $La_2O_3$, $LaSiO_x$, $LaAlO_x$, $SiO_2$, $Ta_2O_5$, $TiO_2$, $Al_2O_3$, and/or $ZrO_2$ relative to, for example, Si, a-Si, c-Si, poly-Si, $Si_3N_4$, Ge and/or SiGe. In some embodiments, the substrate layer on which little or no chemical precursor layer is formed includes $HfO_2$.

To realize hydrocarbon, HFC and/or FC precursor layer deposition on the order of an angstrom or angstroms in thickness, a pulsed hydrocarbon, HFC and/or FC precursor injection into a low power Ar plasma may be used. For example, in some embodiments, a pulsed HFC or FC injection into a low power Ar plasma may be used. For an unbiased substrate, precise HFC or FC film thickness control in the about 1 Å, 2 Å, 3 Å, 4 Å, 5 Å, 6 Å, 7 Å, 8 Å, 9 Å, 10 Å (1 nm), 1.5 nm, 2 nm, 2.5 nm, to about 3 nm range may be possible by adjusting the total number N of hydrocarbon, HFC and/or FC molecules entering the reactor of a plasma system by varying pulse duration and hydrocarbon, HFC and/or FC gas flow rate appropriately. For these conditions, the chemical precursor layer/film thickness may increase linearly with N.

Following chemical precursor deposition, an etching step may be performed in which a small radio frequency (RF) self-bias voltage may be applied for a predetermined length of time. For example, in certain embodiments, a small RF self-bias voltage of −5, −10, −15, −20, −25, −30, −35, −40, −45 and/or −50 V may be applied. As a result, maximum ion energies of 20, 25, 30, 35, 40, 45, 50, 55, 60 and/or 65 eV, respectively, may be created. The small RF self-bias voltage may be applied for an etching step length (ESL) of, for example, about 15 s, about 18 s, about 20 s, about 25 s, about 30 s, or about 35 s. For the low maximum ion energies. $Ar^+$ ion induced physical sputtering of unmodified surface material may be negligible. At the end of a cycle, the process sequence may be repeated to achieve precise control over the total etched thickness. Any number of cycles, for example, from 1 to about 2, 3, 4, 5, 10, 15, 20, 25, or 30, or more, cycles, may be performed in the ALE procedure described herein.

To carry out ALE procedures, according to some embodiments, various plasma systems may be used. For example, in some embodiments, an inductively coupled plasma system may be used. In other embodiments, the plasma system may include capacitively coupled plasma systems, electron cyclotron resonance plasma systems, Helicon wave plasma systems, and electron-beam generated plasma systems. The plasma systems may also include magnetic enhancements and controllers configured to control an amount of chemical precursor deposition, and to control the removal of portions of the chemical precursor layer(s), modified surface layer(s), and controlled portion of the substrate.

The plasma system may be excited at various frequencies, both high and low. For example, according to some embodiments, the plasma system may be excited at, for example, 13.56 MHz. The substrate may be biased at a radiofrequency of for example, 3.7 MHz. The base pressure achieved before processing may be in various ranges, such as, for example, the $1\times10^{-7}$ Torr range, and the temperature of the samples may be stabilized by substrate cooling during plasma processing at, for example, 10° C.

Various materials may also be used with the plasma system. For example, substrates including but not limited to $HfO_2$, Si, $SiO_2$ and/or $Si_3N_4$ portions may be used. The portions may be deposited on a base substrate by plasma-enhanced chemical vapor deposition (PECVD), or any other technique as would be appreciated by one of skill in the art, and studied by, for example, in-situ ellipsometry in real time. In other embodiments, any of the other various substrate materials described above may also be used.

Controlled deposition and/or chemical modification of the surface may allow selective passivation of a material layer, wherein selective removal may be represented in terms of the material that is removed that is not passivated by the precursor layer. To establish strongly-time-dependent etch rates, a sequential approach may be used including a thin hydrocarbon, HFC or FC precursor layer deposition followed by a low energy $Ar^+$ ion etch for selective removal of volatile material.

In order to exhibit etch selectivity, in some embodiments according to methods of the present inventive concept, removal/loss of a first material layer/portion of a substrate may be passivated, resulting in selective removal/loss of a second material layer/portion of the substrate, for example, an ALE in which little of or none of a first material layer/portion, for example, an Si or $Si_3N_4$ layer, and on which a chemical precursor layer is formed, is removed/lost, and in which a portion of a second material layer/portion, for example, an $HfO_2$ layer, and on which little or no chemical precursor layer is formed, is removed, substantially removed, or completely removed in the process. In some embodiments, removal or thickness loss of the first material layer/portion is less than about 5 Å, about 4 Å, about 3 Å, about 2 Å or less than about 1 Å.

In some embodiments, control of ALE etch selectivity may be achieved by a combination of both increased hydrocarbon, HFC and/or FC layer thickness, a shorter ESL, and a low RF bias voltage. For example, in some embodiments, a combination of depositing an about 10 Å thick HFC or FC precursor layer, an ESL of about 18 s, and a −15 V RF bias voltage that generates, for example, Ar ions with a maximum energy of about 30 eV, may be used for selective ALE according to some embodiments.

An exemplary method of ALE may be, according to some embodiments, as follows. The method may include, I) coupling a plasma system to deposit the controlled amount of the chemical precursor on a first portion of a substrate. The method may also include, II) depositing a controlled amount of a chemical precursor on a surface layer of the first portion of the substrate to create a chemical precursor layer and/or a modified surface layer on the first portion of the substrate, with little or no formation of the chemical precursor layer on a surface layer of a second portion of the substrate. The method may further include, III) establishing a gaseous environment of sufficient purity. In certain embodiments, this can be done, in some embodiments, by maintaining an Ar environment without additional precursor injection. The method may also include, IV) controlling a rate of selectively removing the second portion of the substrate, with the chemical precursor layer and/or modified surface layer acting as a passivating layer for the first portion of the substrate.

The method may also include, V) applying a bias potential to the substrate at a level configured to increase ion energies. The method may further include, VI) selectively removing a part of the second portion of the substrate in a cyclical process. The method may also include, VII) again establishing an Ar gaseous environment of sufficient purity. Once an Ar gaseous environment of sufficient purity is again established, the method may be repeated as a cyclical process beginning again from II), until a desired overall etching depth is achieved, or a desired amount of the substrate or a material layer on the substrate is removed. In some embodiments, most of or a substantial portion of a material layer etched using the ALE method is removed, i.e., the material layer is substantially removed, such as more than 80%, removed, more than 90% removed, and more than 95% removed, or more than 98%, 99% or 99.5% removed. In some embodiments, a material layer etched using the ALE method is completely removed, i.e., none of the material layer remains after etching. If desired, variations on pulse length, precursor thickness and/or etching step length (ESL) can vary from cycle to cycle. Thus, it is not required that all cycles be identical. However, in certain embodiments, the cycles may be identical if desired.

Plasma systems in which the methods of the invention may take place, as well as controllers for such systems, include, in some embodiments: systems, including coupled plasma systems; and controllers, such as a computer-implemented controller including a processor and memory, such as is described in U.S. Pat. No. 9,620,382, the content of which is incorporated by reference herein in its entirety.

Having described various aspects of the present invention, the same will be explained in further detail in the following examples, which are included herein for illustration purposes only, and which are not intended to be limiting to the invention.

EXAMPLE

Figure 1:
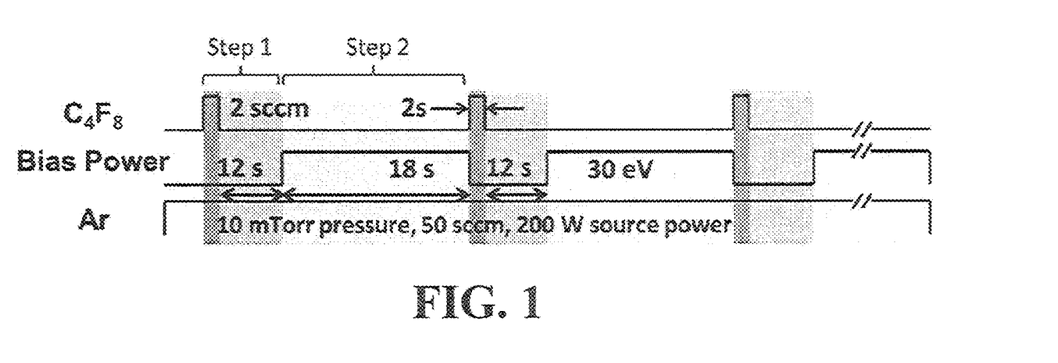
FIG. 1 illustrates a schematic diagram of atomic layer etching (ALE) in a cyclic process. Step 1 in the deposition step employing reactant injections on a surface. Step 2 is the etching step introducing bias for removing weakly-bonded material.

As device fabrication nodes become smaller, higher material etching selectivity and better profile controllability are required. A conventional etching process typically employs a continuous wave (CW) plasma for patterning an electronic circuit by etching a targeted material with selectivity relative to another material. The CW plasma etching has reached its limitation, since etching chemistries and processing parameters are applied at the same time during etching, which increases the difficulty to high precision control. An alternate approach, named atomic layer etching (ALE), has been developed. FIG. 1 is a schematic diagram of the ALE process including with a set of cyclic process for etching the designed material from a few Å to nm with high selectivity. This process, for example, uses 50 sccm Ar as a carrier gas with a reactor pressure of 10 mTorr. A radio frequency (RF) source power of 200 W is used in an inductively coupled plasma (ICP) reactor. Step 1 is a deposition step, in which 2 sccm $C_4F_8$ reactant is injected into the reactor with injection length of 2 second to deposit a fluorocarbon (FC) film on substrate surface, and then the process is followed by 12 second purge in order to pump out the reactive gas. The bias power is employed in step 2 (etching step), accelerating energetic ions to sputter the deposited film and reacted layer. Since this ion energy is selected to below the sputtering energy threshold of the substrate material, once the reactive etchant on the surface deposited in the first step depleted, the etching will self-limited stop. In FIG. 1, step 2 employs an etch step length of 18 second with the ion energy of 30 eV for etching the designed materials.

The mechanism of establishing an ALE process with etching selectivity is crucial. ALE of Si with selectivity to $SiO_2$ has been demonstrated using a reactant as chlorine gas that can selectively convert a monolayer Si into a reacted layer $SiCl_x$ but cannot chlorinate $SiO_2$. The following etch step applies the low-energy $Ar^+$ ions to remove the reacted layer $SiCl_x$ but the energy is insufficient to remove the $SiO_2$ layer and unreacted Si layer. The process using chlorine gas, however, is not available for a semiconductor process that requires etching $SiO_2$ with a selectivity relative to a material with the relatively weak bonding strength, such as Si, SiGe and $Si_3N_4$. More recently, an ALE process with selectivity of $SiO_2$ relative to Si and $Si_3N_4$ using the process flow as shown in FIG. 1 has been demonstrated. The etching selectivity is based upon that $SiO_2$ has a higher FC layer consumption than Si and $Si_3N_4$. Under optimal FC deposition thickness and etching step length, the process is able to establish FC depletion on a $SiO_2$ surface but accumulation of a FC film on a Si and/or $Si_3N_4$ surface for stopping erosion.

Aforementioned two examples exemplify selective ALE in etching Si with selectivity to $SiO_2$ or vice versa, but these kind of approaches have difficulty to establish ALE of a material that has a low FC consumption rate and strong bonding strength, such as $Hfo_2$, with an etching selectivity to another material, such as Si, with a relatively weak bonding strength. In order to develop an ALE process that is capable to etch $HfO_2$ with selectivity to Si, a new etching technique in the deposition step, which can intentionally convert a $HfO_2$ layer to a volatile byproduct without forming a deposition but simultaneously offer accumulating a passivation layer on Si surface, is required. The following etching step applies the low-energy $Ar^+$ ions to selectively remove the reacted $HfO_2$ layer but not Si, so the etching selectivity of $HfO_2$ over Si is achieved. This kind of the processing manner needs the reactants providing material-selective deposition to achieve the etching selectivity in an ALE process.

TABLE L

Molecular formula, name and structure of precursors used in this work.

| Molecular Formula | Name | Structure |
|---|---|---|
| $C_4F_8$ | Octafluoroclyclobutane | (structure) |
| $CH_4$ | Methane | (structure) |
| $CHF_3$ | Trifluoromethane | (structure) |

Figures 2A, 2D:
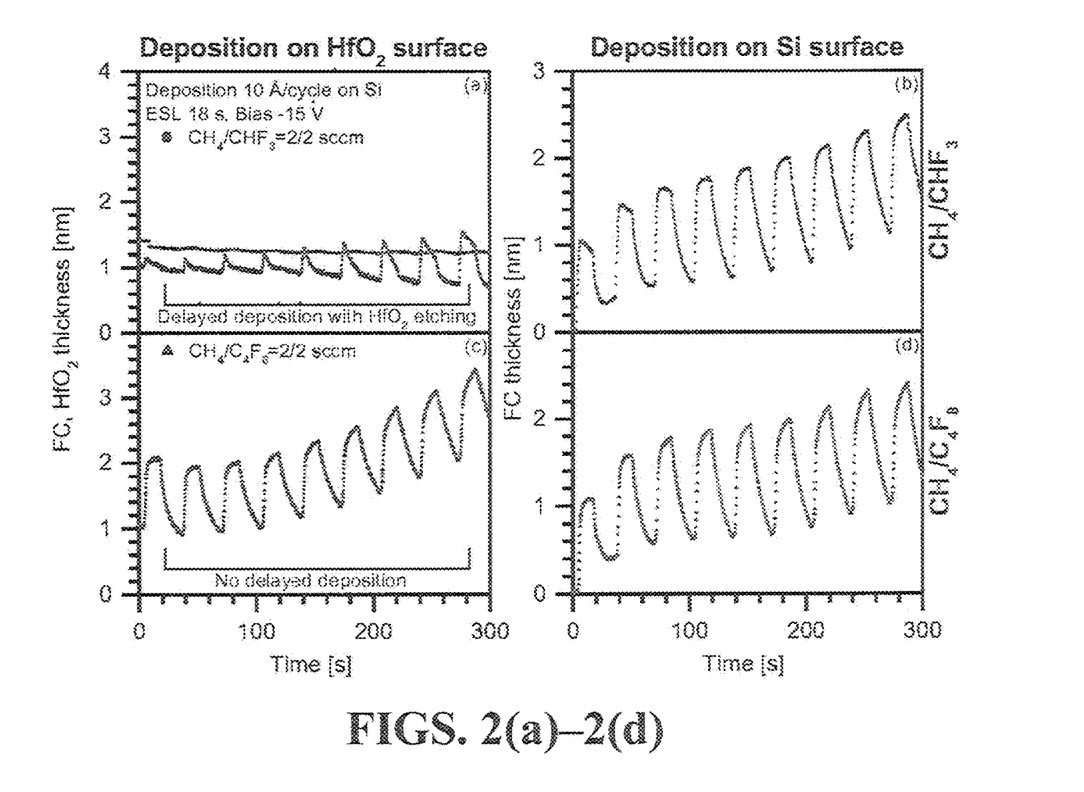

Hydrofluorocarbon (HFC) precursors related to the FC deposition yield difference on $HfO_2$ and Si surfaces, by using two sets of precursors, i.e. $CH_4/CHF_3$ and $CH_4/C_4F_8$. The detailed structure and formula of the hydrocarbon and HFC precursors studied in this work are shown in Table I. The deposition parameter is set to a 10 Å deposition film on the Si surface per cycle, and the identical deposition setting applies to a $HfO_2$ sample. FIG. 2 shows the experimental results of the thickness change of the deposited film, $HfO_2$ and Si films using the selected sets of the precursors, respectively. For the case of using the precursors $CH_4/CHF_3$ in FIGS. 2(a) and (b), the deposition film on a $HfO_2$ surface has a less yield and undergoes self-desorption during the 12 s purge step, whereas the film on a Si surface has a designed 10 Å deposition thickness without reduction of the film thickness during the same purge step. For comparison, the precursors $CH_4/C_4F_8$ give a similar FC film thickness on both $HfO_2$ and Si surfaces, and the deposited film keeps stable or increased thickness during the purge step (see FIGS. 2(c) and (d)). The $CH_4/C_4F_8$ deposited film experiences the thickness reduction only at the etching step, introducing Ar+ ion bombardment to sputter away the FC film. The experimental results demonstrate the capability of $CH_4/CHF_3$ to achieve selectively little or no deposition on $HfO_2$ surface, allowing for the etch step to remove the reacted $HfO_2$ layer. Since $CH_4/CHF_3$ has a higher deposition yield on Si surface, the thick film passivates the underlying Si erosion and offers the etching selectivity.

Figures 3A, 3H:
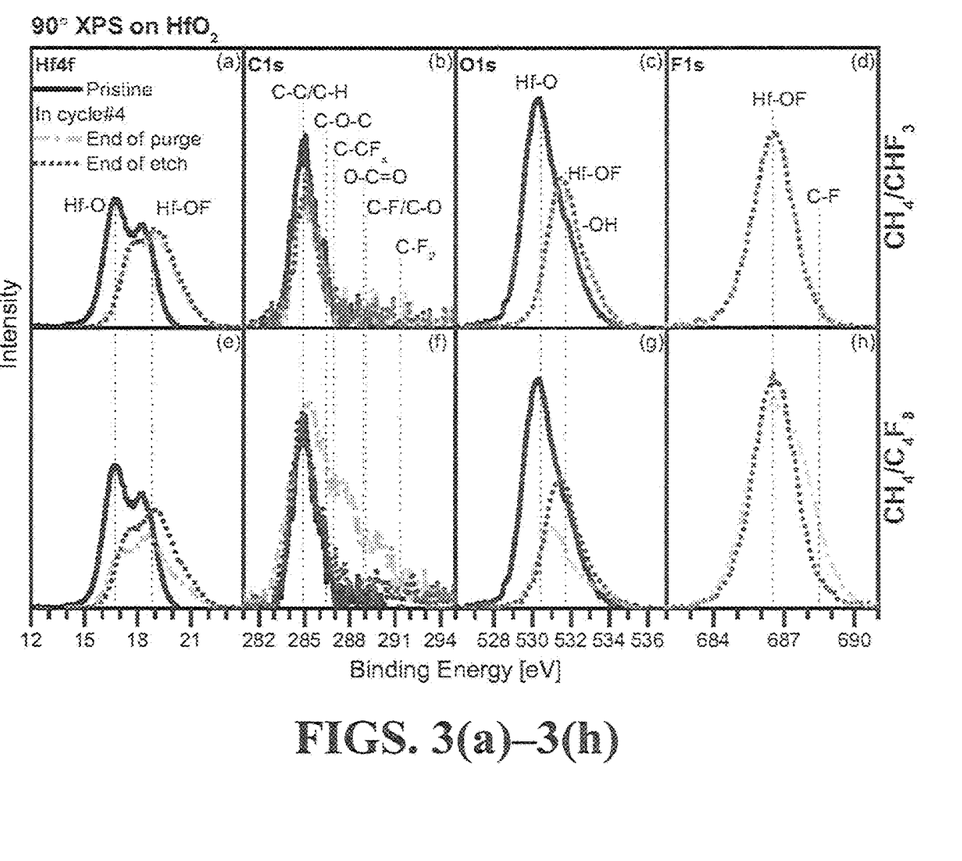

In order to confirm the experimental results in FIG. 2, XPS analysis with a take-off angle of 90° has been conducted on the $HfO_2$ and Si samples, respectively, treated by the selected sets of the precursors, i.e. $CH_4/CHF_3$ and $CH_4/C_4F_8$, at the end of purge and etch steps in the cycle 4. For the case of using $CH_4/CHF_3$ on a $HfO_2$ surface, the C1s spectrum in FIG. 3(b) shows no signal of C—F peaks at the end of purge step, indicating no FC species remaining on the surface. Furthermore, the Hf4f, O1s and F1s spectra in FIGS. 3(a), (c) and (d) show a high degree of fluorinated $HfO_2$ surface, implying that the $HfO_2$ surface terminated with fluorine species prevents from any further FC deposition. This observation agrees that the film deposited by $CH_4/CHF_3$ on the $HfO_2$ surface has a less deposition yield and undergoes self-desorption reaction, as we see in FIG. 2(a). In the etching step, $Ar^+$ ions with a low energy are able to sputter away the fluorinated $HfO_2$ layer. On the other hand, the precursors $CH_4/C_4F_8$ on a $HfO_2$ sample at the end of purge step result in the formation of a thick FC deposition layer on the surface, as shown in FIG. 3(f). The Hf4f and O1s spectra in FIGS. 3(e) and (g) reflect a low degree of fluorination in the underlying $HfO_2$ layer. The following etching step, therefore, sputters away the deposited FC film on the top of the $HfO_2$ surface, and some of fluorine species simultaneously convert $HfO_2$ into a fluorinate $HfO_2$ state. The appearance of Hf—OF peaks in Hf4f, O1s and F1s spectra at the end of etching step (see FIGS. 3(e), (g) and (h)) also agrees with the ion-bombardment induced fluorination of the underlying $HfO_2$ layer. The use of the $CH_4/C_4F_8$ precursors apparently does not provide any etching of $HfO_2$ layer in the ALE sequences.

Figures 4A, 4F:
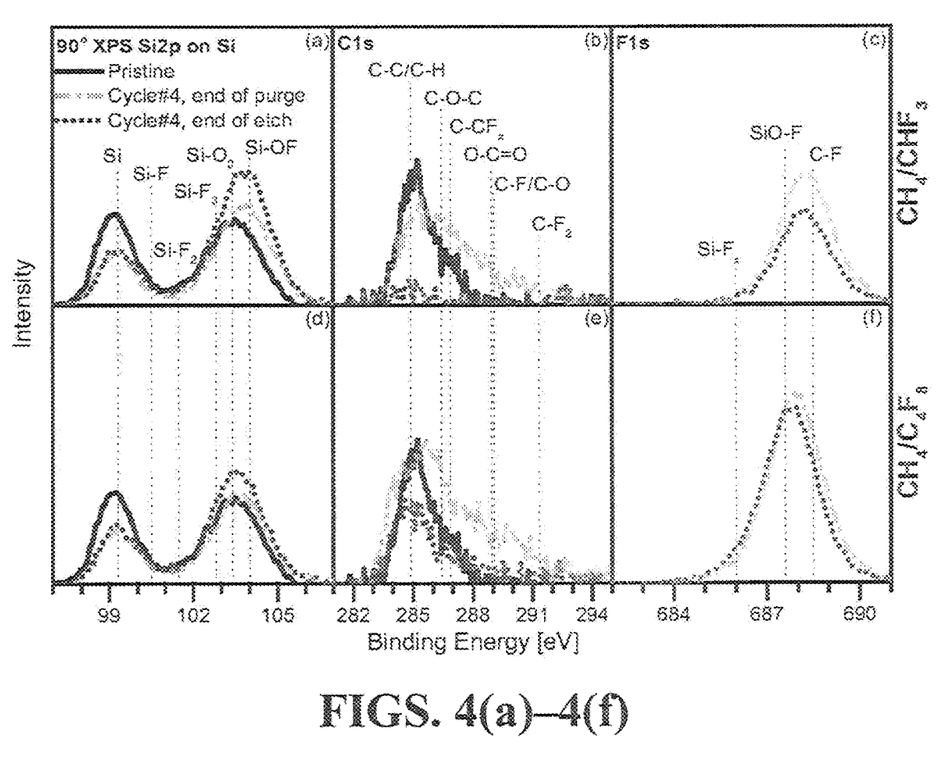

FIG. 4 shows the XPS spectra of the treated Si samples by the identical sets of precursors at the end of purge and etch steps of cycle 4, respectively. The C1s spectra in FIGS. 4(b) and (e) at the end of purge step clearly indicate that both sets of the precursors, i.e. $CH_4/CHF_3$ and $CH_4/C_4F_8$, are able to deposit an FC film on the Si surface. The difference between these two sets is that the $CH_4/CHF_3$-deposited film has a less intensity of the C—F and C—$F_2$ peaks, compared to the $CH_4/CHF_3$-deposited film. The F s spectrum in FIG. 4(c) also shows that the process with the $CH_4/CHF_3$ at the end of purge step leads to the Si surface with a less intensity of the Si—OF peak. It is possibly due to that some fluorine species in the precursors convert Si into a volatile byproduct $SiF_4$ and the remaining carbon species contribute to the deposition of carbon-rich film on the Si surface. The etch step applies the $Ar^+$ ions bombardment, the intensity of C—C and C—F peaks is reduced due to the sputtering effect for both cases.

Figure 5:
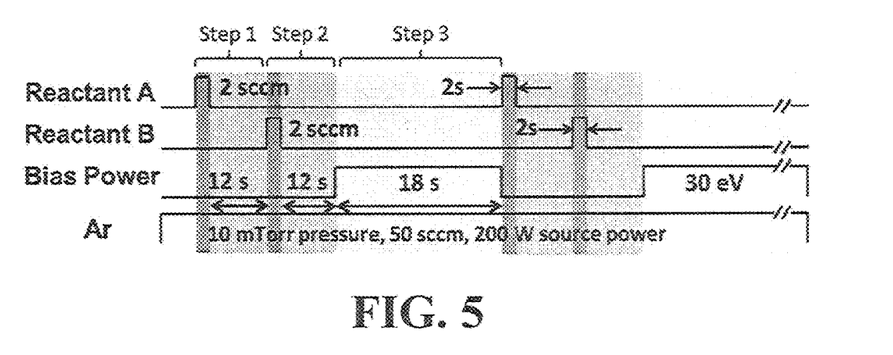
FIG. 5 illustrates a schematic diagram of ALE in a cyclic process. Step 1 in a deposition step employing the injection of A reactant on a surface, and Step 2 in another deposition step employing the injection of B reactant on a surface. Step 3 is the etching step introducing bias for removing weakly-bonded material.

Although the processing sequences in the example include a deposition step and an etching step, the application is also applicable to a processing sequence which includes two separated deposition steps and then an etching step, as shown in FIG. 5. In this example, the reactant A and B used in the step 1 and 2 can be $CH_4$, $CHF_3$ or their substitutions, i.e., a hydrocarbon and/or a monofluorohydrocarbon, and a hydrofluorocarbon and/or a fluorocarbon, as described herein.

The foregoing is illustrative of the present invention and is not to be construed as limiting thereof. The invention is defined by the following claims, with equivalents of the claims to be included therein.

That which is claimed:
1. A method of selectively etching a substrate comprising at least one cycle of:
   depositing a chemical precursor on a surface of the substrate, the substrate comprising a first portion and a second portion, to selectively form a chemical precursor layer on a surface of the first portion of the substrate without forming or substantially without forming the chemical precursor layer on a surface of the second portion of the substrate, wherein the first portion of the substrate and the second portion of the substrate are of different composition;

exposing the chemical precursor layer on the surface of the first portion of the substrate and the surface of the second portion of the substrate to a plasma environment subjected to a bias power; and selectively removing at least a part of the second portion of the substrate, and repeating the cycle until the second portion of the substrate is substantially or completely removed.

2. The method of claim 1, wherein the first portion of the substrate comprises a-Si, c-Si, poly-Si, $Si_3N_4$, SiGe, and/or Ge.

3. The method of claim 2, wherein the first portion of the substrate comprises Si, a-Si, c-Si, and/or poly-Si.

4. The method of claim 1, wherein the second portion of the substrate comprises hafnium oxide ($HfO_2$), hafnium silicate ($HfSiO_x$), nitrided hafnium silicate (HfSiON), lanthanum aluminate ($LaAlO_3$), lanthanum oxide ($La_2O_3$), lanthanum silicate ($LaSiO_x$), silicon oxide ($SiO_2$), aluminum oxide ($Al_2O_3$), tantalum pentoxide ($Ta_2O_5$), titanium dioxide ($TiO_2$), and/or zirconium dioxide ($ZrO_2$).

5. The method of claim 4, wherein the second portion of the substrate comprises $HfO_2$.

6. The method of claim 1, wherein the chemical precursor comprises at least one hydrocarbon or monofluorohydrocarbon, and at least one hydrofluorocarbon or fluorocarbon.

7. The method of claim 6, wherein the at least one hydrocarbon or monofluorohydrocarbon is selected from the group consisting of methane ($CH_4$), fluoromethane ($CH_3F$), acetylene, ethylene, ethane, vinyl fluoride ($H_2C=CHF$), and fluoroethane ($H_3C-CH_2F$).

8. The method of claim 6, wherein the at least one hydrofluorocarbon or fluorocarbon is selected from the group consisting of trifluoromethane ($CHF_3$), tetrafluoromethane ($CF_4$), difluoromethane ($CH_2F_2$), hexafluoroethane ($C_2F_6$), pentafluoroethane ($F_3C-CHF_2$), 1,1,1,2-tetrafluoroethane ($F_3C-CH_2F$), and 1,1,2,2-tetrafluoroethane ($F_2CH-CHF_2$).

9. The method of claim 6, wherein the at least one hydrocarbon or monofluorohydrocarbon is methane ($CH_4$) and the at least one hydrofluorocarbon or fluorocarbon is trifluoromethane ($CHF_3$).

10. The method of claim 1, wherein the plasma environment comprises argon (Ar), or an ion thereof.

11. A method of atomic layer etching comprising at least one cycle of:

depositing a chemical precursor comprising fluorine on a surface of a substrate, the substrate comprising a first portion on a second portion, to selectively form a fluorocarbon film on a surface of the first portion of the substrate without forming or substantially without forming the fluorocarbon film on a surface the second portion of the substrate, wherein the first portion of the substrate and the second portion of the substrate are of different composition;

exposing the fluorocarbon film on the surface of the first portion of the substrate and the surface of the second portion of the substrate to a plasma environment subjected to a bias power, and selectively removing at least a part of the second portion of the substrate, and repeating the cycle until the second portion of the substrate is substantially or completely removed.

12. The method of claim 11, wherein the first portion of the substrate comprises a-Si, c-Si, poly-Si, $Si_3N_4$, SiGe, and/or Ge.

13. The method of claim 12, wherein the first portion of the substrate comprises Si, a-Si, c-Si, and/or poly-Si.

14. The method of claim 11, wherein the second portion of the substrate comprises hafnium oxide ($HfO_2$), hafnium silicate ($HfSiO_x$), nitrided hafnium silicate, (HfSiON), lanthanum aluminate ($LaAlO_3$), lanthanum oxide ($La_2O_3$), lanthanum silicate ($LaSiO_x$), silicon oxide ($SiO_2$), aluminum oxide ($Al_2O_3$), tantalum pentoxide ($Ta_2O_5$), titanium dioxide ($TiO_2$), and/or zirconium dioxide ($ZrO_2$).

15. The method of claim 14, wherein the second portion of the substrate comprises $HfO_2$.

16. The method of claim 11, wherein the chemical precursor comprises at least one hydrocarbon or monofluorohydrocarbon, and at least one hydrofluorocarbon or fluorocarbon.

17. The method of claim 16, wherein the chemical precursor comprises a hydrocarbon and a hydrofluorocarbon, and wherein the hydrocarbon is methane ($CH_4$) and the hydrofluorocarbon is trifluoromethane ($CHF_3$).

18. A method of selectively etching a substrate comprising at least one cycle of:

depositing a chemical precursor comprising a hydrocarbon and a hydrofluorocarbon on a surface of the substrate, the substrate comprising a first portion and a second portion, by exposing the first portion and second portion to the chemical precursor to selectively form a hydrofluorocarbon film on a surface of the first portion of the substrate without forming or substantially without forming the hydrofluorocarbon film on a surface of the second portion of the substrate, the first portion of the substrate comprising a-Si, c-Si, poly-Si, $Si_3N_4$, SiGe, and/or Ge and the second portion of the substrate comprising $HfO_2$;

exposing the hydrofluorocarbon film on the surface of the first portion of the substrate and the surface of the second portion of the substrate to a plasma environment subjected to a bias power, the plasma environment comprising argon (Ar), or an ion thereof; and selectively removing at least a part of the second portion of the substrate, and repeating the cycle until the second portion of the substrate is substantially or completely removed.

19. The method of claim 18, wherein the hydrocarbon is selected from the group consisting of methane, acetylene, ethylene and ethane, and the hydrofluorocarbon is selected from the group consisting of trifluoromethane ($CHF_3$), difluoromethane ($CH_2F_2$), pentafluoroethane ($F_3C-CHF_2$), 1,1,1,2-tetrafluoroethane ($F_3C-CH_2F$), and 1,1,2,2-tetrafluoroethane ($F_2CH-CHF_2$).

20. The method of claim 18, wherein the hydrocarbon is methane ($CH_4$), and the hydrofluorocarbon is trifluoromethane ($CHF_3$).

* * * * *

UNITED STATES PATENT AND TRADEMARK OFFICE
CERTIFICATE OF CORRECTION

| | | |
|---|---|---|
| PATENT NO. | : 10,790,157 B1 | Page 1 of 1 |
| APPLICATION NO. | : 16/512896 | |
| DATED | : September 29, 2020 | |
| INVENTOR(S) | : Oehrlein et al. | |

It is certified that error appears in the above-identified patent and that said Letters Patent is hereby corrected as shown below:

In the Specification

Column 1, Lines 6-12:   Delete STATEMENT OF GOVERNMENT SUPPORT and descriptive paragraph in its entirety Signed and Sealed this
Eighteenth Day of January, 2022

Drew Hirshfeld
*Performing the Functions and Duties of the
Under Secretary of Commerce for Intellectual Property and
Director of the United States Patent and Trademark Office*